United States Patent
Chang

(10) Patent No.: US 10,931,191 B2
(45) Date of Patent: Feb. 23, 2021

(54) HALF BRIDGE CIRCUIT DRIVER CHIP WITH PROTECTION CIRCUIT AND PROTECTION METHOD THEREOF

(71) Applicant: Nuvoton Technology Corporation, Hsinchu (TW)

(72) Inventor: Yu-Chi Chang, Hsinchu Science-based Park (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 411 days.

(21) Appl. No.: 16/110,258

(22) Filed: Aug. 23, 2018

(65) Prior Publication Data

US 2019/0245339 A1    Aug. 8, 2019

(30) Foreign Application Priority Data

Feb. 7, 2018    (TW) .................................. 107104247

(51) Int. Cl.
| | |
|---|---|
| *H02M 1/38* | (2007.01) |
| *H03K 17/16* | (2006.01) |
| *H02H 7/122* | (2006.01) |
| *H03K 17/00* | (2006.01) |
| *H02H 3/20* | (2006.01) |
| *H03K 17/22* | (2006.01) |

(52) U.S. Cl.
CPC ............ *H02M 1/38* (2013.01); *H02H 7/1225* (2013.01); *H03K 17/00* (2013.01); *H03K 17/162* (2013.01); *H02H 3/207* (2013.01); *H03K 17/223* (2013.01); *H03K 2217/0063* (2013.01); *H03K 2217/0072* (2013.01)

(58) Field of Classification Search
CPC ..... H02M 1/38; H03K 17/162; H03K 5/1515; H03K 2217/0063; H03K 2217/0072; H02H 7/1225
See application file for complete search history.

(56) References Cited

U.S. PATENT DOCUMENTS 5,099,138 A * 3/1992 Fukunaga ............... H02M 1/38
326/21

* cited by examiner

*Primary Examiner* — Jared Fureman
*Assistant Examiner* — Christopher J Clark
(74) *Attorney, Agent, or Firm* — Muncy, Geissler, Olds & Lowe, PC

(57) ABSTRACT

A half bridge circuit driver chip and the protection method thereof are provided. The high side voltage detecting circuit connects to a high side signal output terminal and detects the high side turn-on voltage of the high side transistor, so as to obtain a high side turn-on signal. The low side voltage detection circuit connects to a low side signal output terminal and detects a low side turn-on voltage of a low side transistor, so as to obtain a low side turn on signal. When the high side turn-on signal and the low side turn-on signal are received by a protection circuit, a reset signal is generated. The reset signal is sent to the high side driving circuit for turning off the high side transistor and to the low side driving circuit for turning off the low side transistor.

10 Claims, 3 Drawing Sheets

HALF BRIDGE CIRCUIT DRIVER CHIP WITH PROTECTION CIRCUIT AND PROTECTION METHOD THEREOF

CROSS-REFERENCE TO RELATED APPLICATION

This application claims priority from Taiwan Patent Application No. 107104247 filed on Feb. 7, 2018 at Taiwan Intellectual Property Office, the contents of which are hereby incorporated by reference in their entirety for all purposes.

BACKGROUND OF THE INVENTION

1. Field of the Invention

The present invention is related to a half bridge circuit driver chip and a protection method thereof. In particular, the present invention is related to a half bridge circuit driver chip which is able to prevent the high side transistor and the low side transistor from turning on simultaneously and causing a shoot-through phenomenon by means of the voltage detection on the high side signal output terminal and the low side signal output terminal.

2. Description of the Related Art

In conventional technology, a half bridge circuit provides the required high voltage for a load by controlling the switching of the upper transistor and the lower transistor by a driver chip. In a driver chip, there are two regions classified as a high side and a low side. The voltage difference between these two regions may be up to 100V-600V, or may be over 1000V. The switching signal sent by a general controller is not enough for driving the transistor on the high side, but must adjust the voltage level of the switching signal by the voltage level shifter for driving the transistor on the high side. When the transistors on the high side and low side are both driven and turned on, a short may occur between the high voltage power of the system and a ground state so that the transistors on the high side and the low side may be shot through by a large current, thereby causing the damage to the half bridge element. Although the turn-on part of the signal waves may be designed to be separate when sending driving signals, the transistors may be turned on because of the activation of the driving signal caused by noises, thereby causing the shoot-through phenomenon. Even if the over-current protection circuit is combined, the transistor may not be turned off immediately because the response is too slow.

In summary, there are still some significant defects presented in existing half bridge circuits. Hence, the present invention provides a half bridge circuit driver chip and the protection method thereof, in order to improve the said defects and to ensure effective protection when in operation, thereby improving the implementation upon the related industries.

SUMMARY OF THE INVENTION

According to the aforementioned problems, the object of the present invention is to provide a half bridge circuit driver chip and the protection method thereof, in order to prevent the high side transistor and the low side transistor from turning on simultaneously. Thus, the present invention has the ability of solving the problem that the protection circuit is unable to turn off the upper and lower arm circuits immediately causing the damages of the elements by the large current of the short circuit between the system power and the ground.

According to the object of the present invention, a half bridge circuit driver chip is provided, and the half bridge circuit driver chip is configured to control a switching between a high side transistor and a low side transistor and includes: a high side signal input terminal, a high side signal output terminal, a low side signal input terminal, a low side signal output terminal, a first pulse generating circuit, a first voltage level shifter, a high side driving circuit, a high side voltage detecting circuit, a second pulse generating circuit, a second voltage level shifter, a low side driving circuit, a low side voltage detecting circuit and a protection circuit. The high side signal input terminal receives the high side input signal; the high side signal output terminal is connected to the high side transistor. The low side signal input terminal receives the low side input signal. The low side signal output terminal is connected to the low side transistor. The first pulse generating circuit is connected to the high side signal input terminal and converts the high side input signal into the high side pulse signal. The first voltage level shifter is connected to the first pulse generating circuit for elevating the voltage level of the high side pulse signal. The high side driving circuit is connected to the first voltage level shifter, converts the high pulse signal to the high side driving signal, and controls the switching of the high side transistor by the high side signal output terminal. The high side voltage detecting circuit is connected to the high side signal output terminal and detects the high side turn-on voltage when the high side transistor is turned on. The second pulse generating circuit is connected to the high side voltage detecting circuit, and converts the high side turn-on voltage into the high side turn-on pulse. The second voltage level shifter is connected to the second pulse generating circuit, lowers the voltage level of the high side turn-on pulse and generates the high side turn-on signal.

The low side driving circuit is connected to the low side signal input terminal, converts the low side input signal into the low side driving signal, and controls the switching of the low side transistor by the low side signal output terminal. The low side voltage detecting circuit is connected to the low side signal output terminal, detects the low side turn-on voltage when the low side transistor is turned on, and generates the low side turn-on signal. The protection circuit is connected to the second voltage level shifter and the low side voltage detecting circuit. When receiving the high side turn-on signal and the low side turn-on signal, a reset signal is generated and output to the first pulse generating circuit, the first pulse generating circuit transmits the reset signal to the first voltage level shifter, the first voltage level shifter converts the reset signal to the high side driving circuit for turning off the high side driving circuit and to the low side driving circuit for turning off the low side driving circuit.

Preferably, the high side voltage detecting circuit may include a first resistance and a second resistance connected in series and disposed between the high side signal output terminal and the high side floating ground terminal. A high side branch voltage is generated by the voltage division of the first resistance and the second resistance, and is sent to the first comparator to be compared to the first reference voltage. The high side turn-on voltage is output when the high side branch voltage is higher than the first reference voltage.

Preferably, the low voltage detecting circuit may include a third resistance and a fourth resistance connected in series and disposed between the low side signal output terminal and a low side ground terminal. The low side branch voltage is generated by the voltage division of the third resistance and the fourth resistance, and is sent to the second comparator to compare with the second reference voltage. The low side turn-on voltage is output when the low side branch voltage is higher than the second reference voltage.

Preferably, the protection circuit may include an AND gate and a first flip-flop. The AND gate is connected to the second voltage level shifter and the low side voltage detecting circuit. When receiving the high side turn-on signal and the low side turn-on signal, the first flip-flop is triggered and generates the reset signal.

Preferably, the high side driving circuit may include a second flip-flop. The second flip-flop is triggered by the ascent pulse signal and the descent decline pulse signal within the high side pulse signal and outputs the high side driving signal for turning the high side transistor on or off.

Another object of the present invention is to provide a protection method for a half bridge circuit driver chip and the half bridge circuit driver chip is configured to control the switching between the high side transistor and the low side transistor. The protection method for the half bridge circuit driver chip includes the steps as follows: receiving the high side input signal by the high side signal input terminal, and receiving the low side input signal by the low side signal input terminal; converting the high side input signal into the high side pulse signal by the first pulse generating circuit, and sending the high side pulse signal to the first voltage level shifter to elevate the voltage level of the high side pulse signal; converting the high side pulse signal into the high side driving signal by the high side driving circuit, and controlling the switching of the high side transistor by the high side signal output terminal; detecting the high side turn-on voltage by the high side voltage detecting circuit when the high side transistor is turned on, converting the high side turn-on voltage to the high side turn-on pulse by the second pulse generating circuit, sending the high side turn-on pulse to a second voltage level shifter to lower the voltage level of the high side turn-on pulse and generate the high side turn-on signal; converting the low side input signal into the low side driving signal by the low side driving circuit, and controlling the switching of the low side transistor by the low side signal output terminal; detecting the low side turn-on voltage by the low side voltage detecting circuit when the low side transistor is turned on and generating the low side turn-on signal; generating a reset signal by a protection circuit when the high side turn-on signal and the low side turn-on signal are generated; and sending the reset signal to the high side driving circuit for turning off the high side transistor, and sending the reset signal to the low side driving circuit for turning off the low side transistor.

Preferably, the high side voltage detecting circuit provides the voltage division between the high side signal output terminal and the high side floating ground terminal to generate the high side branch voltage by the first resistance and the second resistance, and compares the high side branch voltage with a first reference voltage of the first comparator to generate the high side turn-on voltage.

Preferably, the low side voltage detecting circuit provides a voltage division between the low side signal output terminal and a low side ground terminal to generate a low side branch voltage by the third resistance and the fourth resistance, and compares the low side branch voltage with the second reference voltage of the second comparator to generate the low side turn-on voltage.

Preferably, the protection circuit triggers the first flip-flop to generate the reset signal when receiving the high side turn-on signal and the low side turn-on signal by inputs of the high side turn-on signal and the low side turn-on signal received by an AND gate.

Preferably, the high side driving circuit outputs the high side driving signal for turning on or off the high side transistor by inputs of the ascent pulse signal and the descent pulse signal within the high side pulse signal received by the second flip-flop.

Accordingly, the half bridge circuit driver chip and the protection method thereof of the present invention possess one or more advantages as follows:

First, the half bridge circuit driver chip and the protection method thereof may receive the transistor turn-on status monitored by the high side voltage detecting circuit and the low side voltage detecting circuit by the protection circuit. When receiving the high side turn-on signal and the low side turn-on signal simultaneously, the high side transistor and the low side transistor will be turned off immediately to prevent the shoot-through phenomenon, thereby improving the safety of operation.

Secondly, the half bridge circuit driver chip and the protection method thereof may monitor the driving signal turned on by the high side and low side transistors by the high side voltage detecting circuit and the low side voltage detecting circuit. In a case where interference by noise affects the driving signal and results in the false activation of the transistors, the damage of circuit elements caused by the short circuit may be prevented.

Thirdly, the half bridge circuit driver chip and the protection method thereof may prevent elements from the damage caused by the low response of an over-current protection circuit by means of directly sending a reset signal to turn off the high side and low side transistors by the protection circuit. Hence, the protection efficiency and immediacy are improved.

DESCRIPTION OF THE PREFERRED EMBODIMENTS

Figure 1:
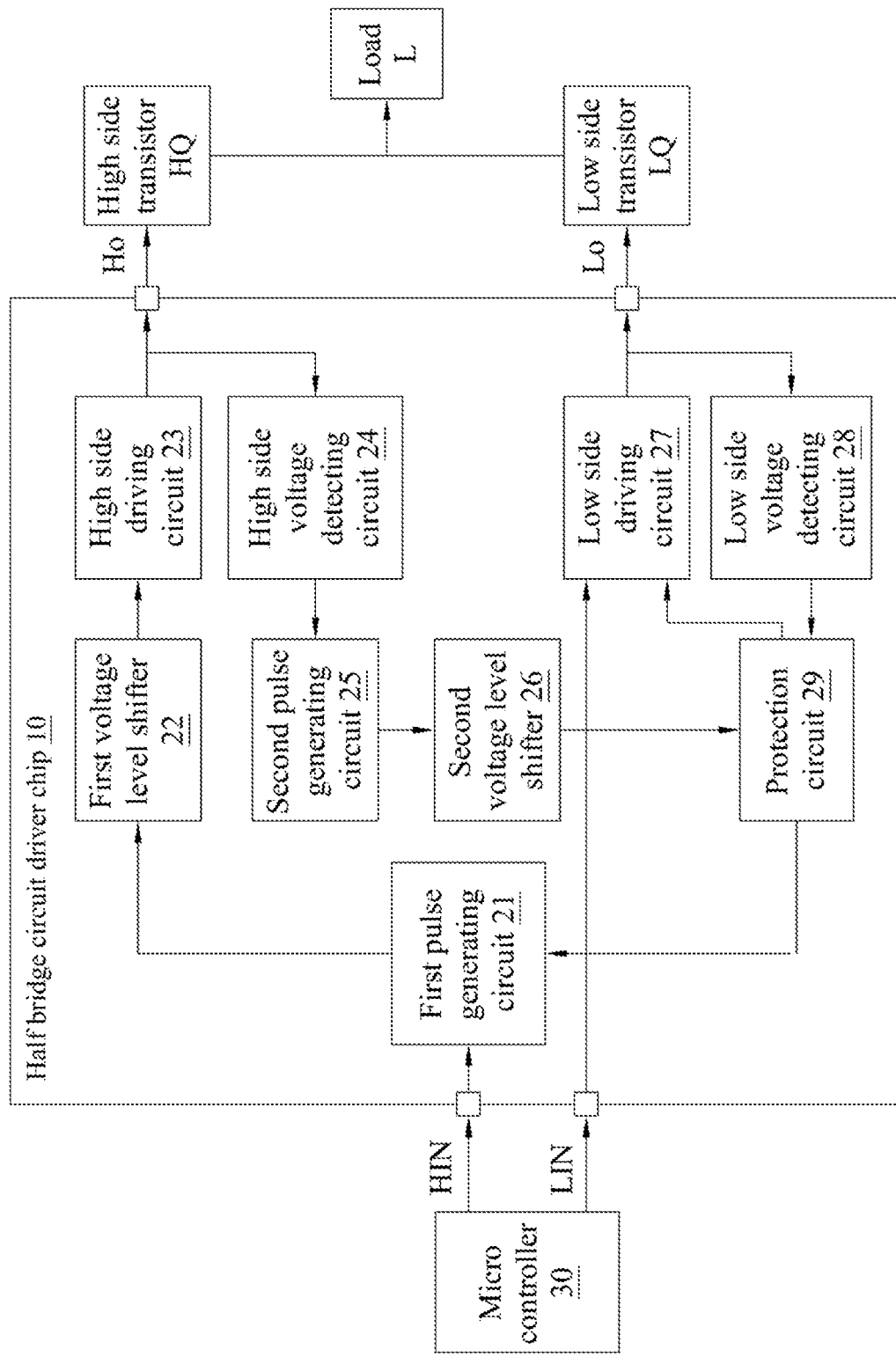
FIG. 1 is a block diagram of the half bridge circuit driver chip of an embodiment of the present invention.

For ease of explaining the technical features, contents and advantages of the present creation to the Examiner, the present creation will be described hereinafter by embodiments taken in conjunction with the appended drawings. The mentioned drawings are only for demonstrating and supporting this specification but are not exactly the real ratio and accurate configuration upon implementation. Hence, the creation shall not be realized only depending on the ratios and configurations shown in the drawings, and shall not be limited upon practice.

Please refer to FIG. 1, FIG. 1 is a block diagram of the half bridge circuit driver chip of an embodiment of the present invention. As shown in the figure, the half bridge circuit driver chip 10 includes input and output terminals such as a high side signal input terminal HIN, a low side signal input terminal LIN, a high side signal output terminal HO, and a low side signal output terminal LO. The half bridge circuit driver chip 10 may send a high side input signal to a high side signal input terminal HIN and send a low side input signal to a low side signal input terminal LIN by a micro controller 30. The high side signal output terminal HO and the low side signal output terminal LO of the half bridge circuit driver chip 10 are connected to the high side transistor HQ and the low side transistor LQ respectively. By controlling the turn-on or turn-off status of the transistor by using the high side output signal and the low side output signal, the load L will be driven. Further, the half bridge circuit driver chip 10 includes a first pulse generating circuit 21, a first voltage level shifter 22, a high side driving circuit 23, a high side voltage detecting circuit 24, a second pulse generating circuit 25, a second voltage level shifter 26, a low side driving circuit 27, a low side voltage detecting circuit 28 and a protection circuit 29 therein.

The first pulse generating circuit 21 is connected to the high side signal input terminal HIN, and converts the received high side input signal into the high side pulse signal and then sends the high side pulse signal to first voltage level shifter 22. The high side pulse signal must elevate its voltage level by the first voltage level shifter 22 to have the ability to drive the high side transistor. The high side driving circuit 23 is connected to the first voltage level shifter 22 and generates a high side driving signal from the converted high side pulse signal and outputs the high side driving signal by the high side signal output terminal HO, in order to control the turn-on or turn-off status of the high side transistor HQ. In this case, in order to detect the switching status of the high side transistor HQ immediately, a high side voltage detecting circuit 24 is disposed to connect to the high side signal output terminal HO. By detecting the driving voltage when the high side transistor HQ is turned on, the driving voltage is compared with the predetermined reference voltage to generate the high side turn-on voltage. The voltage signal of the high side turn-on voltage is converted into a signal of a high side turn-on pulse by the second pulse generating circuit 25. The voltage level of the high side turn-on pulse is then lowered by the second voltage level shifter 26 to generate a high side turn-on signal.

The low side driving circuit 27 connects to a low side signal input terminal LIN, converts the low side input signal into a low side driving signal and then outputs the low side driving signal by the low side signal output terminal LO in order to control the turn-on or turn-off status of the low side transistor LQ. Similarly, in order to detect the switching status of the low side transistor LQ, a low side voltage detecting circuit 28 is disposed to connect to the low side signal output terminal LO. By detecting the driving voltage when the low side transistor LQ is turned on and comparing the driving voltage with the predetermined reference voltage, the low side turn-on voltage is generated and acted as the low side turn-on signal. Since both the high side signal output terminal HO and the low side signal output terminal LO are able to monitor the turn-on or turn-off status of the transistor, a short circuit shall be prevented by the protection circuit 29 when the high side turn-on signal and the low side turn-on signal appear simultaneously. The protection circuit 29 connects to the second voltage level shifter 26 and the low side voltage detecting circuit 28. When receiving the high side turn-on signal and the low side turn-on signal at the same time, a reset signal is generated and is sent to the first pulse generation circuit 21. The reset signal is converted by the first voltage level shifter 22 and the converted reset signal is sent to the high side driving circuit 23 to turn off the high side transistor HQ. Simultaneously, the reset signal is sent to the low side driving circuit 27 to turn off the low side transistor LQ. In the other words, when the detection circuit detects the signals of turn-on status of the high side transistor HQ and the low side transistor LQ, the high side transistor HQ and the low side transistor LQ will be turned off rapidly by the reset signal to prevent the short circuit occurred between the system power and the ground due to the turn-on status of the high side transistor HQ and the low side transistor LQ, and the condition of element damage caused by large current.

Figure 2:
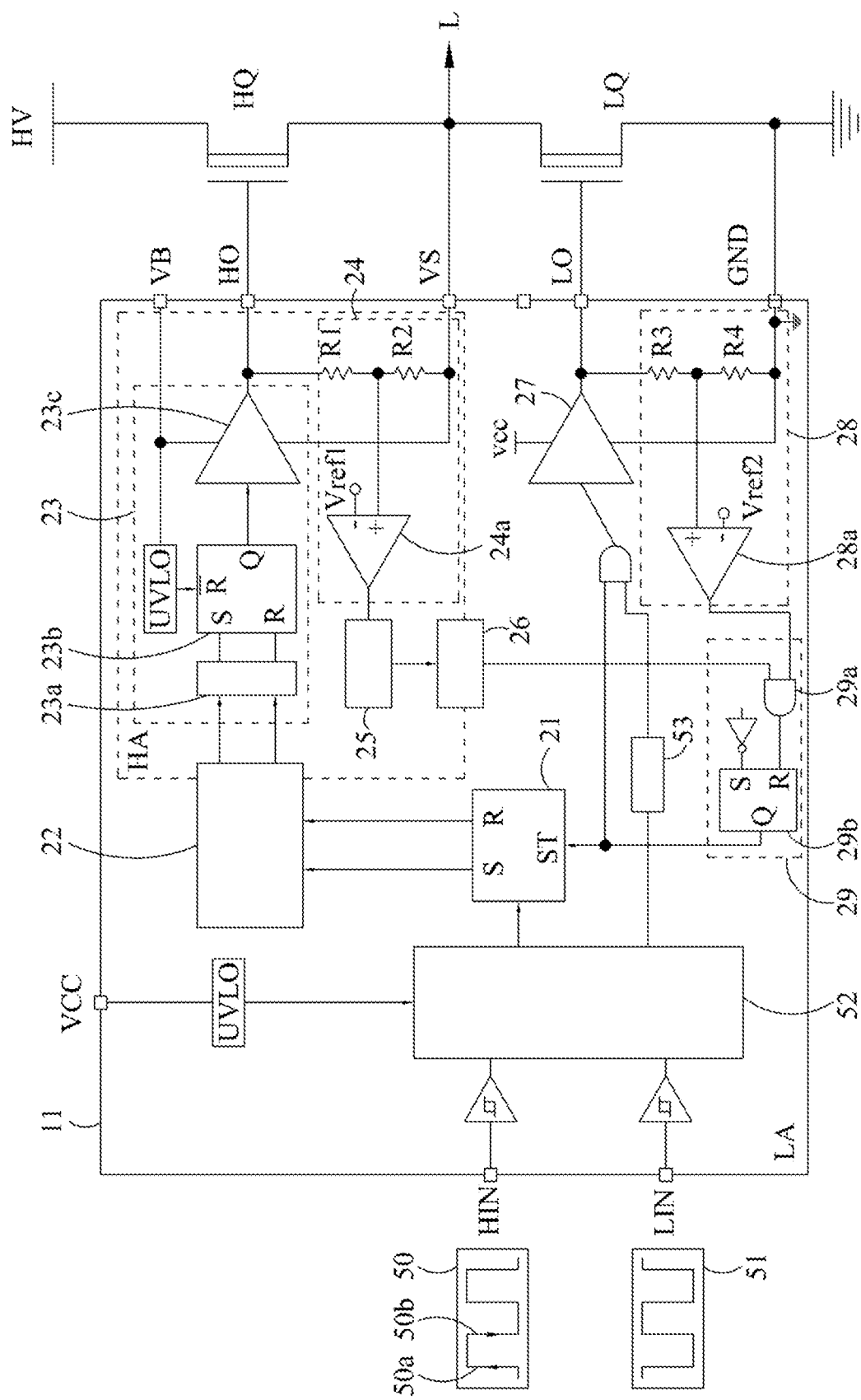
FIG. 2 is a schematic view of a circuit of the half bridge circuit driver chip of an embodiment of the present invention.

Please refer to FIG. 2, FIG. 2 is a schematic view of a circuit of the half bridge circuit driver chip of an embodiment of the present invention. As shown in the figure, the circuits related to the above embodiments may be achieved by various circuit elements. The elements same as the aforementioned embodiments will be indicated by the same labels. The half bridge circuit may be assembled by the half bridge circuit driver chip 11 connected to the high side transistor HQ and the low side transistor LQ. The terminal of the high side transistor HQ is connected to the high voltage power HV, and the another terminal of the high side transistor HQ is connected to the load L. The terminal of the low side transistor LQ is connected to the load L, and the another terminal of the low side transistor LQ is connected to the ground. The half bridge driver chip 10 controls the turn-on or turn-off status of the high side transistor HQ of the upper arm and turn-on or turn-off status of the low side transistor LQ of the lower arm and provides the required voltage for load L by controlling the switching between the high side transistor HQ and the low side transistor LQ. On the other hand, the half bridge circuit may further include a charge pump connected to the high side power terminal VB of the half bridge circuit driver chip 11 and connected to the power supply voltage VCC by an external diode and capacitor.

In the half bridge circuit driver chip 11, the chip input terminal may include a high side signal input terminal HIN and a low side input terminal LIN, which receive the high side input signal 50 and the low side input signal 51 of the micro controller respectively. The said input signals may be pulse width modulation (PWM) signals, of which the waveform has a rising edge 50a and a falling edge 50b as the foundation of controlling to switch the transistors to the turn-on or turn-off status. The chip output terminal may include the high side signal output terminal HO and the low side signal output terminal LO. The high side signal output terminal HO is connected to the high side transistor HQ to provide the high side driving signal to switch the high side transistor HQ to the turn-on status or turn-off status. The low side signal output terminal LO is connected to the low side transistor LQ to provide the low side driving signal to switch the low side transistor LQ to the turn-on status or turn-off status.

When the half bridge circuit is in operation, if the high side transistor HQ is switched to the turn-on status, the high voltage power HV will be provided to the load L. In this case, the high side floating ground terminal VS will also withstand the high voltage to generate a voltage difference between the high side area HA and the low side area LA within the half bridge circuit driver chip 11 of about 20 V to 600 V, or even up to 1200V. At the same time, if the low side transistor LQ is also in the turn-on status, the high current of the high voltage power HV will directly flow into the ground and generate a shoot-through phenomenon, thereby resulting in the damage of elements. In order to prevent the said shoot-through phenomenon, the existing prevention method is mainly receiving the high side input signal 50 of the high side signal input terminal HIN and low side input signal 51 of the low side signal input terminal LIN by the logic circuit 52, and setting a safety time by the logic circuit 52, e.g. the raised low side input signal 50 is sent by the delay circuit 53 when the delay of the falling edge 50b of the high side input signal 50 is over the safety time, so that the turn-on part of the high side input signal 50 can be avoid from being overlapped with that of the low side input signal 50. However, this can only prevent the input signals from overlapping at the input terminals. The high voltage elements within the half bridge circuit may have a result that the output signals of the high side signal output terminal HO and the low side signal output LO are not synchronized with the input signals due to the interference by noise, thereby leading to an error activation that the high side transistor HQ and the low side transistor LQ are turned on simultaneously. Therefore, the shoot-through phenomenon caused by the short circuit between the high voltage power and the ground is generated.

Besides the said prevention method of the logic circuit 52, the half bridge circuit may also be combined with the over-current protection circuit and dispose an external resistance between the low side transistor LQ and the ground terminal to detect the current status of the external resistance. When the said shoot-through phenomenon occurs, an abnormal-current signal will be sent to the microprocessor by the over-current protection circuit since the current will exceed the predetermined safety threshold, and the microprocessor will send a turn-off signal to turn off the upper and lower arms to protect the system. However, when an occurrence of high conducting current of the high side transistor HQ and the low side transistor LQ is detected at the same time, the response of the over-current protection circuit is slow and the upper and lower arms are unable to be turned-off immediately to prevent the elements from damage.

In order to solve the aforementioned defects, the present embodiment determines the actual switching status of the high side signal output terminal HO and the low side signal output terminal LO by detecting the driving voltages of the high side signal output terminal HO and the low side signal output terminal LO. Therefore, the condition that the high side transistor HQ and the low side transistor LQ are turned on at the same time may be prevented. Here, the internal elements and the operation of the half bridge circuit driver chip 11 may be described in detail below.

The microprocessor sends the high side input signal 50 to the high side signal input terminal HIN and sends the low side input signal 51 to the low side signal input terminal LIN. The high side input signal 50 and the low side input signal 51 may be checked by the logic circuit 52 to preclude the overlapped signals at the situation that the upper and lower arms are turned on at the same time. In this case, the high side input signal 50 is sent to the first pulse generating circuit 21, and the rising edge 50a and the falling edge 50b of the high side input signal 50 is converted into a high side pulse signal including an ascent pulse signal and a descent pulse signal. The voltage level of the said high side pulse signal shall be elevated by the first voltage level shifter 22 in order to reach the sufficient voltage level for driving the high side transistor HQ. The first voltage level shifter 22 may be a metal-oxide-semiconductor field-effect transistor (MOSFET) element. The converted pulse signal is sent to the high side driving circuit 23, and the high side driving circuit 23 converts the high side pulse signal into a high side driving signal and outputs the high side driving signal by the high side signal output terminal HO to control the switching of the high side transistor HQ. The high side driving circuit 23 may include a pulse determination circuit 23a, a second flip-flop 23b and a driver 23c. The pulse determination circuit 23a must determine the converted pulse signal as rising or falling because the shifting of the voltage level of the pulse signal is only conducted by the single voltage level shifter in the present embodiment. And the pules determination circuit 23a may determine the converted pulse signal as rising or falling by the number or the width of the current or the pulse signal of the single voltage level shifter. The rising pulse signal and the falling pulse signal are classified and then sent to the second flip-flop 23b. The pulse signals can trigger the second flip-flop 23b to generate the high side driving signal, and the high side driving signal switches the high side transistor HQ by the driver 23c which may be an inverter. On the other hand, the low side input signal 51 is sent to the low side driving circuit 27 by the delay circuit 53. The low side driving circuit 27 may be a driver circuit such as an inverter, which converts the low side input signal 51 into the low side driving signal. The low side driving signal is output by the low side signal output terminal LO to switch the low side transistor LQ.

In order to detect the switching status of the high side transistor HQ, a high side voltage detecting circuit 24 is disposed on the high side signal output terminal HO to detect the driving voltage of the high side transistor HQ. The high side voltage detecting circuit 24 may dispose voltage division resistances including a first resistance R1 and a second resistance R2 between the high side signal output terminal HO and the high side floating ground terminal VS to capture the high side branch voltage between the high side signal output terminal HO and the high side floating ground terminal VS and then the high side branch voltage is compared with the predetermined first reference voltage Vref1 by the first comparator. Since the driving signal about turning on the high side transistor HQ may generate a higher driving voltage, the high side branch voltage may be determined as a turn-on signal if the voltage is larger than the first reference voltage Vref1, and the high side turn-on voltage will be output by the first comparator 24a. In this case, since the high side voltage detecting circuit 24 is located at the high side region HA, the high side turn-on voltage output by the first comparator 24 shall be converted into the high side turn-on pulse by the second pulse generating circuit 25, and the voltage level of the high side turn-on pulse shall be lowered by the second voltage level shifter 26, in order to generate the high side turn-on signal comparing with the low side region LA.

Similarly, the low side driving signal is output by the low side signal output terminal LO. Hence, a low side voltage detecting circuit 28 is disposed at the low side signal output terminal LO and detects the driving voltage of the low side transistor LQ. The low side voltage detecting circuit 28 may dispose voltage division resistances including the third resistance R3 and the fourth resistance R4 between the low side signal output terminal LO and the ground terminal GND, in order to capture the low side branch voltage between the low side signal output terminal LO and the ground terminal GND and the low side branch voltage is compared with the predetermined second reference voltage Vref2 by the second comparator 28a. Since the driving signal for turning on the low side transistor LQ may generate a higher driving voltage, if the low side branch voltage is still higher than the second reference voltage vref2, then the voltage may be determined as a turn-on signal, and the low side turn-on voltage will be output by the second comparator 28a. In this case, the low side turn-on voltage may be considered as the low side turn-on signal, and a low side turn-on voltage is output by the second comparator 28a. At this time, the low side turn-on voltage may be considered as a low side turn-on signal.

The turn-on signals generated by the output terminal are sent to the protection circuit 29. The protection circuit 29 includes an AND gate 29a and a first flip-flop 29b. The AND gate 29a is connected to the second voltage level shifter 26 and the low side voltage detecting circuit 28, and triggers the first flip-flop 29b to generate a reset signal when simultaneously receiving the high side turn-on signal and the low side turn-on signal. The reset signal is output to the first pulse generating circuit 21. The voltage level of the reset signal is converted by the first voltage level shifter 22. The reset signal is then sent to the high side driving circuit 23 and output by the high side signal output terminal HO for turning off the high side transistor HQ. At the same time, the rest signal is also output to the low side driving circuit 27, and is output by the low side signal output terminal LO for turning off the low side transistor LQ. As shown in the aforementioned protection circuit of the present embodiment, when the high side transistor HQ and the low side transistor LQ are detected as all turned-on, the upper and lower arm circuits may be turned-off immediately by the reset signal in order to prevent the shoot-through phenomenon. The way of unlocking the reset signal lock to restore the normal output is to wait until the power supply voltage VCC is restarted, which may immediately and efficiently prevent the shoot-through phenomenon.

Figure 3:
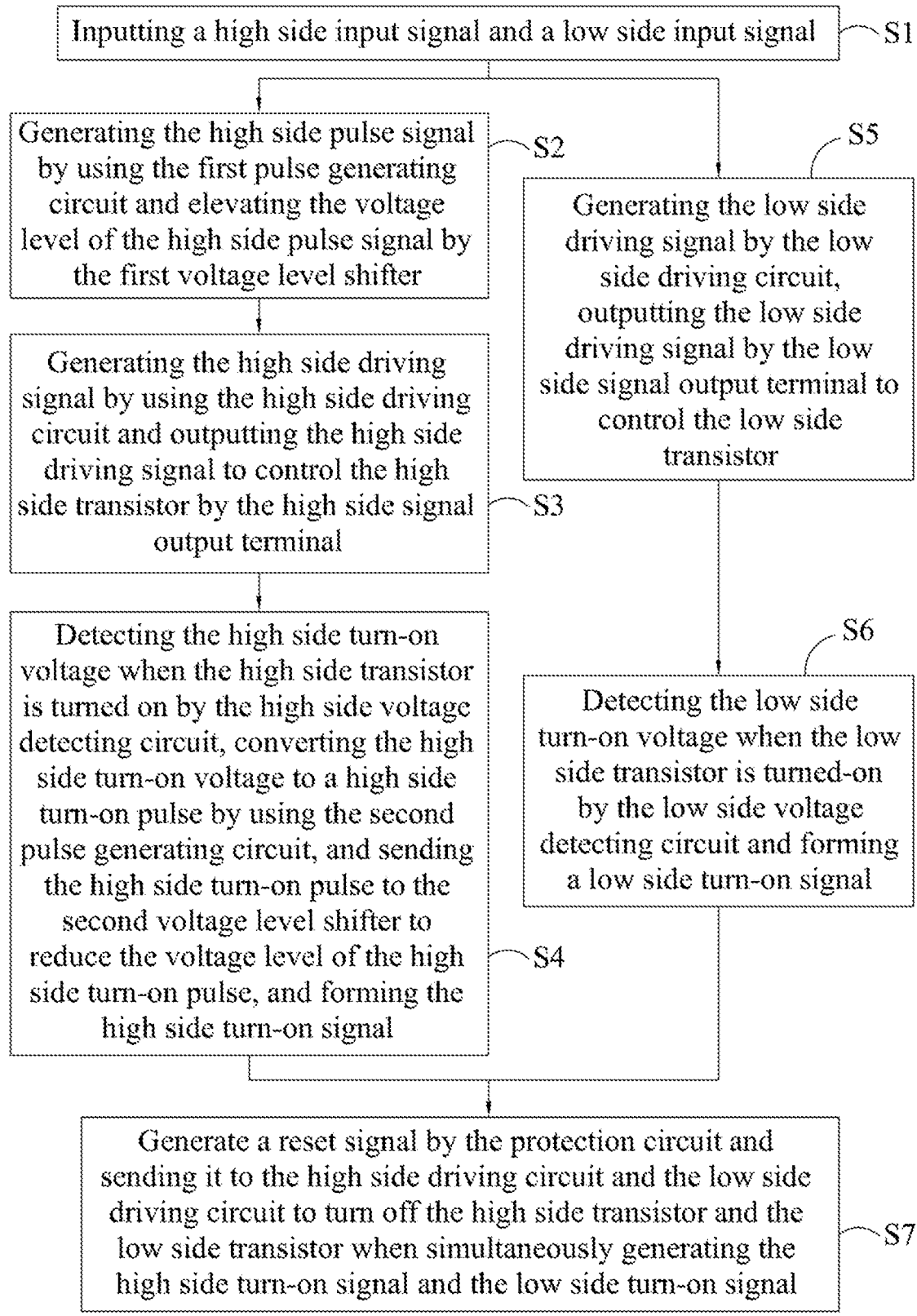
FIG. 3 is a flow chart of the protection method of the half bridge circuit driver chip of an embodiment of the present invention.

Please refer to FIG. 3, FIG. 3 is a flow chart of the protection method of the half bridge circuit driver chip of an embodiment of the present invention. As shown in the figure, the protection method includes following steps (S1-S7):

Step S1 inputs a high side input signal and a low side input signal. The half bridge circuit driver chip may receive the high side input signal by the high side signal input terminal and receive the low side input signal by the low side signal input terminal.

Step S2 generates a high side pulse signal by the first pulse generating circuit and elevate the voltage level of the high side pulse signal by the first voltage level shifter. The high side input signal is received by the high side signal input terminal and is converted to a rising pulse signal and a falling pulse signal by a first pulse generating circuit. Since the voltage level of the signals are not sufficient to drive the high side transistor to switch, the voltage level of the signals need to be elevated by the first voltage level shifter.

Step S3 generates a high side driving signal by a high side driving circuit, and outputs the high side driving signal to control the high side transistor by the high side signal output terminal. The high side pulse signal of which the voltage level is elevated by the first voltage level shifter reconstructs the waveform of the high side input signal depending on the rising pulse signal and the falling pulse signal, and triggers the second flip-flop to output a high side driving signal thereby. The high side driving signal is output by the high side signal output terminal to control the switching of the high side transistor.

Step S4 detects a high side turn-on voltage by the high side voltage detecting circuit when a high side transistor is turned on, converts the high side turn-on voltage into a high side turn-on pulse by the second pulse generating circuit, sends the high side turn-on pulse to the second voltage level shifter to lower the voltage level of the high side turn-on pulse, and generates a high side turn-on signal. By disposing voltage division resistance between the high side signal output terminal and the high side floating ground terminal, detecting the high side branch voltage between the high side signal output terminal and the high side floating ground terminal, and comparing the high side branch voltage with the predetermined reference voltage by the first comparator, the high side turn-on voltage may be determined as output by the first comparator when the high side branch voltage is higher than the reference voltage. By means of outputting the high side turn-on voltage, the turn-on status of the high side transistor is monitored. In this case, the voltage signal of the high side turn-on voltage shall also be converted to a signal of high side turn-on pulse by the second pulse generating circuit, and the second voltage level shifter lowers the voltage level of the high side turn-on pulse so that the high side turn-on pulse which is able to be received by the low side terminal may be generated.

Step S5 generates a low side driving signal by using the low side driving circuit, and then outputs the low side driving signal by the low side signal output terminal to control the low side transistor. In the high and low side regions, the low side input signal received by the low side signal input terminal is sent to the low side driving circuit, and the low side input signal is converted to the low side driving signal by the low side driving circuit and the low side driving signal is output by the low side signal output terminal to control the switching of the low side transistor to turn on or turn off.

Step S6 detects the low side turn-on voltage by the low side voltage detecting circuit when the low side transistor is turned on, and generates a low side turn-on signal. Voltage division resistances are disposed between the low side signal output terminal and the low side ground terminal, and the lower side branch voltage between the low side signal output terminal and the low side around terminal is detected. By comparing the lower side branch voltage with the predetermined reference voltage by the second comparator, if the low side branch voltage is higher than the reference voltage, the second comparator outputs the low side turn-on voltage. By outputting the low side turn-on voltage, the turn-on status of the low side transistor is monitored. In the low side region, the low side turn-on voltage output by the second comparator may directly be acted as a low side turn-on signal.

Step S7 generates a reset signal by the protection circuit and sends the reset signal to the high side driving circuit to turn off the high side transistor when simultaneously generating the high side turn-on signal and the low side turn-on signal. The half bridge driver chip may prevent the high side transistor and the low side transistor from turning on at the same time by disposing the protection circuit. By connecting the AND gate in the protection circuit with the second voltage level shifter and the low side voltage detecting circuit, when receiving the high side turn-on signal and the low side turn-on signal at the same time, a reset signal is generated by triggering the first flip-flop. The reset signal may be sent to the high side driving circuit and the low side driving circuit at the same time for turning off the high side transistor and the low side transistor simultaneously. Since the said step is to detect the driving signal about turning on the transistor and to generate the reset signal for turning off the upper and lower arms circuits immediately, the change of the overcurrent may be detected before the shooting of the high current. Hence, the shoot-through phenomenon may be efficiently avoided, and the configuration may be beneficial for protecting the elements of the half bridge circuit and the driving chip.

It is to be understood that the present disclosure is not limited to the contents described above. Any equivalent modifications, variations and enhancements can be made thereto by those skilled in the art without changing the essential characteristics or technical spirit of the present disclosure, the technical and protective scope of which is defined by the appending claims.

What is claimed is:

1. A half bridge circuit driver chip, which is configured to control a switching between a high side transistor and a low side transistor, comprising:
    a high side signal input terminal receiving a high side input signal;
    a high side signal output terminal connected to the high side transistor;
    a low side signal input terminal receiving a low side input signal;
    a low side signal output terminal connected to the low side transistor;
    a first pulse generating circuit connected to the high side signal input terminal and converting the high side input signal into a high side pulse signal;
    a first voltage level shifter connected to the first pulse generating circuit and elevating a voltage level of the high side pulse signal;
    a high side driving circuit connected to the first voltage level shifter, converting the high side pulse signal to a high side driving signal, and controlling the switching of the high side transistor by the high side signal output terminal;
    a high side voltage detecting circuit connected to the high side signal output terminal and detecting a high side turn-on voltage when turning on the high side transistor;
    a second pulse generating circuit connected to the high side voltage detecting circuit and converting the high side turn-on voltage into a high side turn-on pulse;
    a second voltage level shifter connected to the second pulse generating circuit, lowering a voltage level of the high side turn-on pulse and generating a high side turn-on signal;
    a low side driving circuit connected to the low side signal input terminal, converting the low side input signal into a low side driving signal, and controlling the switching of the low side transistor by the low side signal output terminal;
    a low side voltage detecting circuit connected to the low side signal output terminal, detecting a low side turn-on voltage when turning on the low side transistor and generating a low side turn-on signal; and
    a protection circuit connected to the second voltage level shifter and the low side voltage detecting circuit, wherein, when receiving the high side turn-on signal and the low side turn-on signal, a reset signal is generated and output to the first pulse generating circuit, the first pulse generating circuit transmits the reset signal to the first voltage level shifter, the first voltage level shifter converts the reset signal to the high side driving circuit for turning off the high side driving circuit and to the low side driving circuit for turning off the low side driving circuit.

2. The half bridge circuit driver chip according to claim 1, wherein the high side voltage detecting circuit comprises a first resistance and a second resistance connected in series and disposed between the high side signal output terminal and a high side floating ground terminal; a voltage division of the first resistance and the second resistance generates a high side branch voltage and the high side branch voltage is sent to a first comparator to compare with a first reference voltage, when the high side branch voltage is higher than the first reference voltage, the high side turn-on voltage is output.

3. The half bridge circuit driver chip according to of claim 1, wherein the low voltage detecting circuit comprises a third resistance and a fourth resistance connected in series and disposed between the low side signal output terminal and a low side ground terminal;
    wherein a voltage division of the third resistance and the fourth resistance generates a low side branch voltage and the low side branch voltage is sent to a second comparator to compare with a second reference voltage, and when the low side branch voltage is higher than the second reference voltage, the low side turn-on voltage is output.

4. The half bridge circuit driver chip according to claim 1, wherein the protection circuit comprises an AND gate and a first flip-flop; the AND gate is connected to the second voltage level shifter and the low side voltage detecting circuit;
    wherein when the protection circuit receives the high side turn-on signal and the low side turn-on signal, the first flip-flop is triggered and generates the reset signal.

5. The half bridge circuit driver chip according to claim 1, wherein the high side driving circuit comprises a second flip-flop triggered by an ascent pulse signal or a descent pulse signal within the high side pulse signal for outputting the high side driving signal turning on or off the high side transistor.

6. A protection method for a half bridge circuit driver chip, wherein the half bridge circuit driver chip is configured to control a switching between a high side transistor and a low side transistor, and the protection method comprises steps as follows:
    receiving a high side input signal by a high side signal input terminal, and receiving a low side input signal by a low side signal input terminal;
    converting the high side input signal into a high side pulse signal by a first pulse generating circuit, and sending the high side pulse signal to a first voltage level shifter to elevate a voltage level of the high side pulse signal;
    converting the high side pulse signal into a high side driving signal by a high side driving circuit, and controlling a switching of the high side transistor by a high side signal output terminal;
    detecting a high side turn-on voltage by a high side voltage detecting circuit when the high side transistor is turned on, converting the high side turn-on voltage to a high side turn-on pulse by a second pulse generating circuit, sending the high side turn-on pulse to a second voltage level shifter to lower the voltage level of the high side turn-on pulse and generate a high side turn-on signal;
    converting the low side input signal into a low side driving signal by a low side driving circuit, and controlling a switching of the low side transistor by a low side signal output terminal;
    detecting a low side turn-on voltage by a low side voltage detecting circuit when the low side transistor is turned on, and generating a low side turn-on signal; and
    generating a reset signal by a protection circuit when the high side turn-on signal and the low side turn-on signal are generated;
    sending the reset signal to the high side driving circuit to turn off the high side transistor, and sending the reset signal to the low side driving circuit to turn off the low side transistor.

7. The protection method according to claim 6, wherein the high side voltage detection circuit provides a voltage division between the high side signal output terminal and a high side floating ground terminal in order to generate a high side branch voltage by a first resistance and a second resistance, and comparing the high side branch voltage with a first reference voltage by a first comparator to generate the high side turn-on voltage.

8. The protection method according to claim 6, wherein the low side voltage detection circuit provides a voltage division between the low side signal output terminal and a low side ground terminal to generate a low side branch voltage by a third resistance and a fourth resistance, and the low side voltage detection circuit compares the low side branch voltage with a second reference voltage by a second comparator to generate the low side turn-on voltage.

9. The protection method according to claim 6, wherein the protection circuit triggers a first flip-flop to generate the reset signal when receiving the high side turn-on signal and the low side turn-on signal by inputs of the high side turn-on signal and the low side turn-on signal received by an AND gate.

10. The protection method according to claim 6, wherein the high side driver circuit outputs the high side driving signal for turning on or off the high side transistor by inputs of an ascent pulse signal and a descent pulse signal within the high side pulse signal received by a second flip-flop.

* * * * *